United States Patent [19]

Asakawa et al.

[11] Patent Number: 5,035,835
[45] Date of Patent: Jul. 30, 1991

[54] MODULATORY MOLECULAR ELEMENT

[75] Inventors: Shiro Asakawa, Tokyo; Yasuhiko Machida, Yokohama; Akira Taomoto, Tokyo; Katsuhiro Nichogi, Kawasaki, all of Japan

[73] Assignee: Matsushita Electric Industrial Co., Ltd., Japan

[21] Appl. No.: 169,037

[22] Filed: Mar. 16, 1988

[30] Foreign Application Priority Data

Mar. 24, 1987 [JP] Japan .................................. 62-69336

[51] Int. Cl.$^5$ .............................................. H01B 1/00
[52] U.S. Cl. ..................................... 252/500; 252/518
[58] Field of Search ....................... 252/500, 512, 518; 428/411.1, 500

[56] References Cited

U.S. PATENT DOCUMENTS 4,622,170 11/1986 Wynne et al. ......................... 252/518

FOREIGN PATENT DOCUMENTS 0178606 4/1986 European Pat. Off. .
8700347 1/1987 PCT Int'l Appl. .

OTHER PUBLICATIONS

Technische Rundschau, vol. 78, No. 10, Mar. 1986, pp. 72-81, Bern CH; G. KäKampf: "Polymere Datenspeicher".
IEEE Spectrum, vol. 18, No. 12, Dec. 1981, p. 17; "Whatever happened to molecular electronics?"
Applied Physics Letters vol. 49, No. 18, 3rd Nov. 1986, pp. 1210-1212, American Institute of Physics, New York, U.S.; A. Tsumura et al.: "Macromolecular electronics device: Field-effect transistor with a polythiophene thin film".
Electronique Applications, No. 26, Oct./Nov. 1982, pp. 41-48; J. Tremolieres: "L'emploi des polymeres en en electronique: Speculation ou revolution technologique".
Japanese Journal of Applied Physics Supplements, vol. 22, suppl. No. 22-1, 1983, pp. 473-478, Tokyo, JP; H. Shirakawa: "Polyacetylene: A typical semiconducting and metallic polymer".

*Primary Examiner*—Josephine Barr
*Attorney, Agent, or Firm*—Lowe, Price, Leblanc & Becker

[57] ABSTRACT

A modulatory molecular element includes a chain of molecules A and molecules Bi. The molecules A alternate with the molecules Bi and are bound to the adjacent molecules Bi. The molecules A are selected from common molecules. The molecules Bi are selected from at least two different types of molecules. The molecules Bi are changeable from first stable states to second stable states in response to applied stimulative energy. The molecules Bi return from the second stable states to the first stable states at different relaxation time constants dependent on the types of the molecules Bi when the applied stimulative energy is removed. The chain has a physical property which depends on whether or not all the molecules Bi are in the second stable states.

8 Claims, 4 Drawing Sheets

MODULATORY MOLECULAR ELEMENT

BACKGROUND OF THE INVENTION

This invention relates to a modulatory element including bound molecules. The modulatory element is usable in an information processing system.

Proposed computers are intended to perform complicated information processing such as learning, pattern processing, associations, and intuition. Such computers may require unsimple processor elements having the function of processing inputs.

SUMMARY OF THE INVENTION

It is an object of this invention to provide an unsimple processor element.

In accordance with this invention, a modulatory molecular element includes a chain of molecules A and molecules Bi. The molecules A alternate with the molecules Bi and are bound to the adjacent molecules Bi. The molecules A are selected from common molecules. The molecules Bi are selected from at least two different types of molecules. The molecules Bi are changeable from first stable states to second stable states in response to applied stimulative energy. The molecules Bi return from the second stable states to the first stable states at different relaxation time constants dependent on the types of the molecules Bi when the applied stimulative energy is removed. The chain has a physical property which depends on whether or not all the molecules Bi are in the second stable states.

DESCRIPTION OF THE PREFERRED EMBODIMENTS

A modulatory molecular element of this invention is made of various one-dimensional electrically-conductive substances such a series of covalent $\pi$ electrons like polyacetylene, a charge transfer complex having donors and acceptors forming respective columns, a charge transfer complex having alternately-arranged donors and acceptors forming a column, a chelate compound including metal atoms and ligands, a metal salt, a metal chelate, a metal chelate having ligands, or a chalcogenide.

The modulatory molecular element is changeable between different states with an applied stimulative energy in a transition process. As the modulatory molecular element changes between the different states, conditions of bonds between molecules in the element change and the electrical conductivity of the element varies. The transition may result from a physical property intrinsic to the one-dimensional conductive substance, or may be a macroscopic structural transition or an electrical transition. For example, there are Peierls' transition, a charge density wave transition, a spin Peierls' transition, a cis-trans transition, a hydrogen transfer, a spiropyran-cyanine dye transition, a bond exchange structural variation, a neutral-ionic transition, a transition with a valence change, an order-disorder transition, or a liquid crystal transition.

The applied stimulative energy is in various forms such as light, electromagnetic wave, electric field, heat, pressure, magnetic field, or mass transfer. The applied stimulative energy is preferably in a form of light, electromagnetic wave, electric field, or mass transfer.

Opposite ends of the modulatory molecular element may be provided with electrodes allowing an electrical connection to the modulatory molecular element. Only one end of the modulatory molecular element may be provided with an electrode, and the other end thereof may be electrically connected to an external circuit via electrochemical solution.

Figure 1:
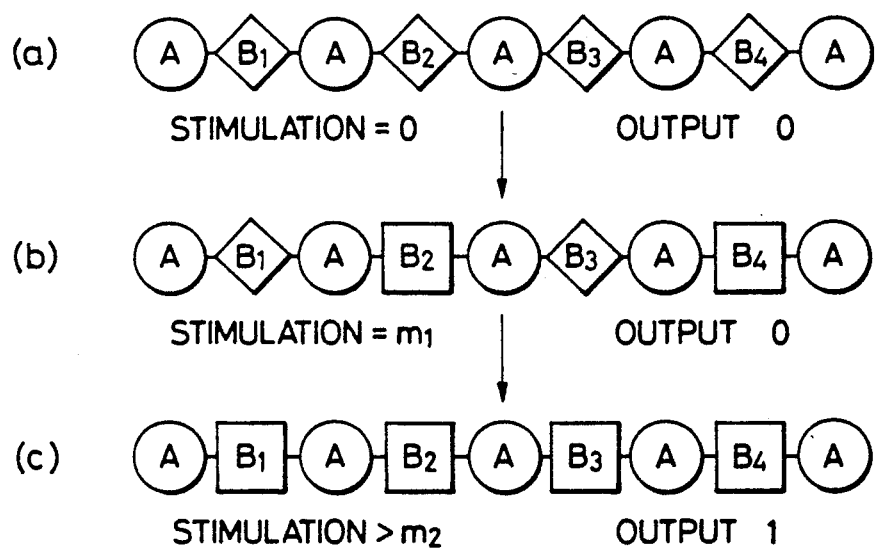
FIG. 1 is a diagram of three different states of a modulatory molecular element according to an embodiment of this invention.

With reference to FIG. 1, a modulatory molecular element according an embodiment of this invention includes bounded molecules A, B1, B2, B3, and B4 arranged in one-dimensional chains as A·B1·A·B2·A·B-3·A·B4·A·····A. The one-dimensional chains extend in parallel. It should be noted that FIG. 1 shows part of the one-dimensional molecular chains of the modulatory molecular element. The molecules B1-B4 belong to a common molecular species. The molecules B1-B4 are changeable between first stable states and second stable states. In FIG. 1, diamonds represent that the related molecules B1-B4 are in their first stable states, while squares represent that the related molecules B1-B4 are in their second stable states. When the molecules B1-B4 are in their first stable states, they weakly interact with the adjacent molecules A and the pairs of the molecules A and B1-B4 are electrically nonconductive. When the molecules B1-B4 are in their second stable states, they strongly interact with the adjacent molecules A and the pairs of the molecules A and B1-B4 are electrically conductive. The molecules B1-B4 change from their first stable states to their second stable states at different levels of applied energies. When the applied energies are removed, the molecules B1-B4 return from their second stable states to their first stable states at different relaxation rates or time constants.

FIG. 1(a) shows a condition of the modulatory molecular element where all the molecules B1-B4 are in their first stable states so that the modulatory molecular element is nonconductive. As shown in FIG. 1(b), when a stimulative energy equal to a given level ml is applied to the modulatory molecular element, the molecules B2 and B4 are changed to their second stable states but the molecules B1 and B3 remain in their first stable states. In this case, the pairs of the molecules A and B2 or B4 are conductive but the pairs of the molecules A and B1 or B3 retain nonconductive so that the modulatory molecular element is nonconductive. As shown in FIG. 1(c), when a stimulative energy greater than a given level m2 which exceeds the level m1 is applied to the modulatory molecular element, all the molecules B1–B4 are changed to their second stable states and thus all the pairs of the molecules A and B1–B4 are conductive so that the modulatory molecular element is also conductive. Thus, the stimulative energy level m2 corresponds to a threshold with respect to the change of the modulatory molecular element from its nonconductive state to its conductive state.

It is assumed that the molecules B1 and B3 have relaxation time constants greater than those of the other molecules B2 and B4. When the stimulative energy is removed, the molecules B2 and B4 return to their first stable states and then the molecules B1 and B3 return to their first stable states. During the interval from the moment of the return of the molecules B2 and B4 to their first stable states until the moment of the return of the molecules B1 and B3 to their first stable states, when a stimulative energy equal to the level m1 is applied to the modulatory molecular element, the molecules B2 and B4 are changed to their second stable states again so that the modulatory molecular element is made conductive again. In this way, the threshold with respect to the change of the modulatory molecular element from its nonconductive state to its conductive state is shifted from the energy level m2 to the energy level m1. This process corresponds to the function of a memory.

The molecule A may be replaced by a set of bound molecules. The molecules B1–B4 may be replaced by different sets of bound molecules.

The arrangement of the modulatory molecular element may be in other forms such as AB1·AB1·AB2·AB2·····.

The modulatory molecular element is formed in various ways such as an LB technique (Langmuir-Blodgett's technique), a molecular beam epitaxial method (MBE method), and a liquid phase epitaxial method.

In a first example of a way of manufacturing the one-dimensional molecular chains of the modulatory molecular element, tetrathiofulvalene (TTF) and chloranyl (CA), bromanyl (BA), fluoranyl (FA), dichlorobenzoquinone (DBQ), or dinitrobenzene (DNB) was dissolved in acetonitrile and the resultant solution was left as it was for about two months, obtaining a charge transfer complex crystal including desired one-dimensional molecular chains. In the manufactured charge transfer complexes, acceptors may result from only one of the previously-mentioned substances or from arbitrary combinations of the substances. It should be noted that films of the charge transfer complexes may be formed in vacuum deposition.

In a second example of a way of manufacturing the one-dimensional molecular chains of the modulatory molecular element, each of layers of crystals of ion phthalocyanine or lead phthalocyanine including desired one-dimensional molecular chains was formed by putting the material into a Knudsen cell and heating the cell to a temperature of 200°–250° C. under a vacuum of $10^{-10}$ Torr. Similarly, pyrazine was put into another Knudsen cell and was then cooled by liquid nitrogen, and the temperature thereof was controlled via a heater so that a desired one-dimensional structure of phthalocyanine-pyrazine was obtained.

Figure 2:
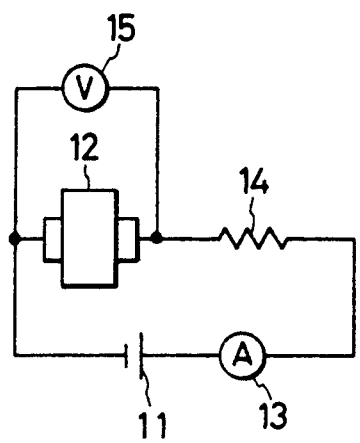
FIG. 2 is a schematic diagram of the modulatory molecular element and a circuit for measuring characteristics of the modulatory molecular element.

As shown in FIG. 2, during the measurement of characteristics of a modulatory molecular element of this invention, a dc power source 11 generating a variable potential was connected across the modulatory molecular element 12 via an ammeter 13 and a resistor 14. In addition, a voltmeter 15 was connected across the modulatory molecular element 12.

Figure 3:
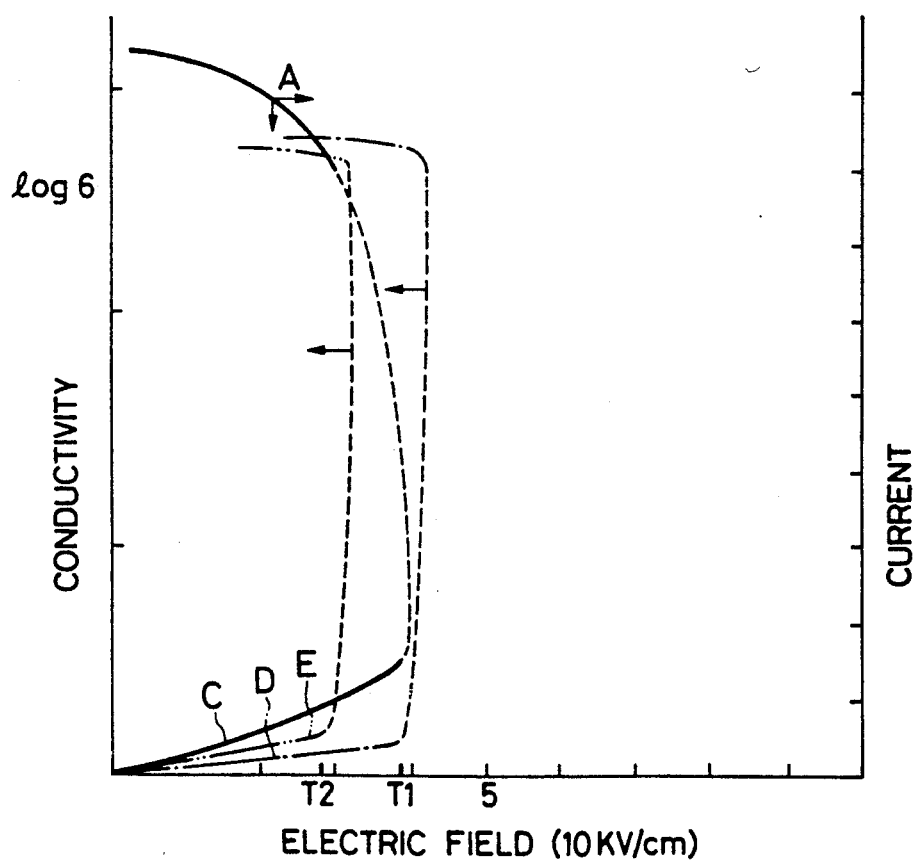
FIG. 3 is a graph of the measured characteristics of the modulatory molecular element.

FIG. 3 shows the measured characteristics of a modulatory molecular element of a TTF complex. As shown by the curve C in FIG. 3, in a range below a transition point T1, the electric current passing through the modulatory molecular element increased with the electric field applied to the modulatory molecular element at moderate rates. When the electric field reached the transition point T1, the electric current increased abruptly. This means that a nonconductive-conductive transition occurs in the modulatory molecular element at the electric field point T1. The transition point T1 corresponds to a threshold. In this case, as shown by the line D in FIG. 3, the electrical conductivity of the modulatory molecular element increased with the electric field at smaller rates until the electric field increased to the transition point T1. When the electric field reached the transition point T1, the electrical conductivity increased abruptly. At the time approximately 10-minute after the removal of the electric field from the modulatory molecular element, similar measurement of the characteristics of the modulatory molecular element was performed again. In this case, as shown by the electric field-conductivity characteristic curve E of FIG. 3, a transition occurred at an electric field point T2 lower than the previous transition point T1. The transition point T2 corresponds to a second threshold. In this way, the threshold is shiftable.

It was found that transition points T1 and T2 depended on types of substances forming acceptors in a charge transfer complex.

Figure 4:
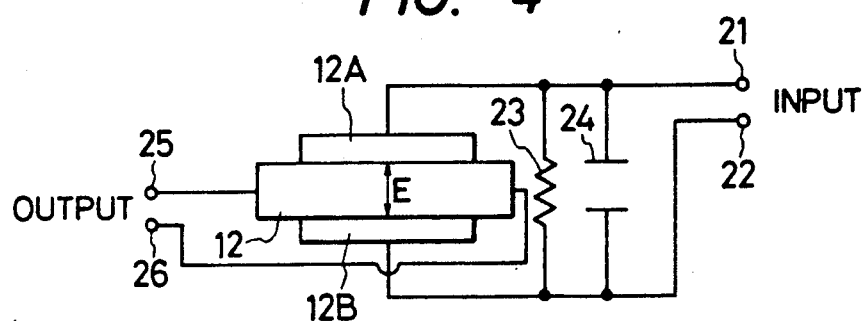
FIG. 4 is a schematic diagram of the modulatory molecular element having input and output terminals.

As shown in FIG. 4, the modulatory molecular element 12 has a pair of input electrodes 12A and 12B between which the one-dimensional molecular chains are sandwiched. The input electrodes 12A and 12B extend parallel to the direction of the one-dimensional molecular chains. The input electrodes 12A and 12B are connected to input terminals 21 and 22 respectively. A resistor 23 and a capacitor 24 are connected between the input electrodes 12A and 12B. Output terminals 25 and 26 are connected to opposite ends of the one-dimensional molecular chains. An input signal is applied between the input terminals 21 and 22 in the form of a variable dc potential so that an electric field corresponding to the input signal is applied to a body of the moldulatory molecular element 12. The resistance between the output terminals 25 and 26 varies in accordance with the applied electric field, that is, the input signal. Accordingly, an output signal representing the conductivity of the body of the modulatory molecular element can be transmitted via the output terminals 25 and 26.

Figure 5:
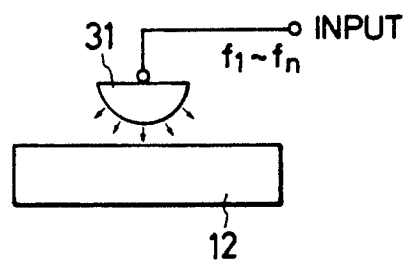
FIG. 5 is a diagram of the modulatory molecular element having a device for applying stimulative energy in a form of lights.

As shown in FIG. 5, a stimulative energy dependent on an input signal may be applied to the modulatory molecular element 12 in the form of lights which are emitted from a source 31 and which have wavelengths f1,···,fn corresponding to molecules B1,···,Bn respectively.

Figure 6:
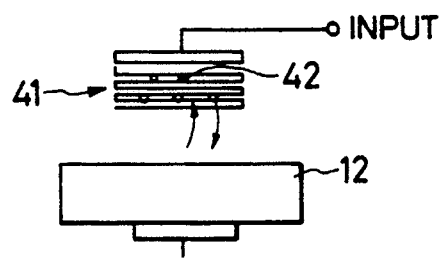
FIG. 6 is a diagram of the modulatory molecular element having a device for applying stimulative energy via mass transfer.

As shown in FIG. 6, a stimulative energy dependent on an input signal may be applied to the modulatory molecular element 12 in a doping or mass transfer process. In this case, a device 41 diffuses dopants 42 into the one-dimensional chains at a rate which depends on a level of the input signal.

Figure 7:
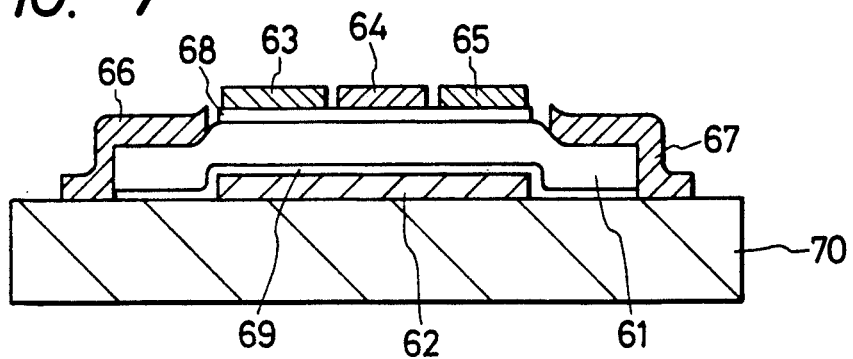
FIG. 7 is a sectional view of a modulatory molecular element according to another embodiment of this invention.
Figure 8:
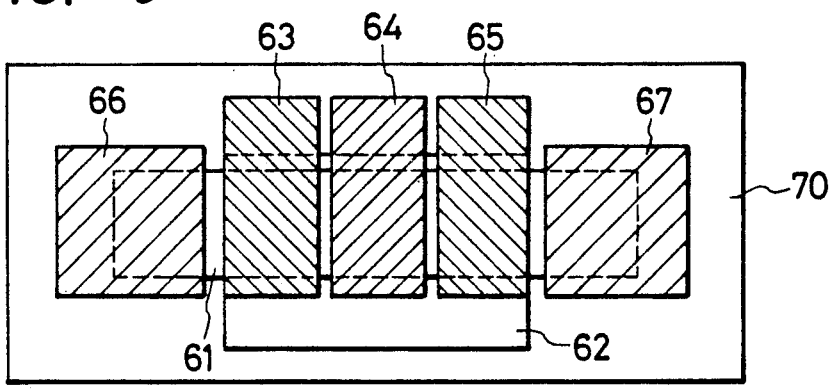
FIG. 8 is a top view of the modulatory molecular element of FIG. 7.
Figure 9:
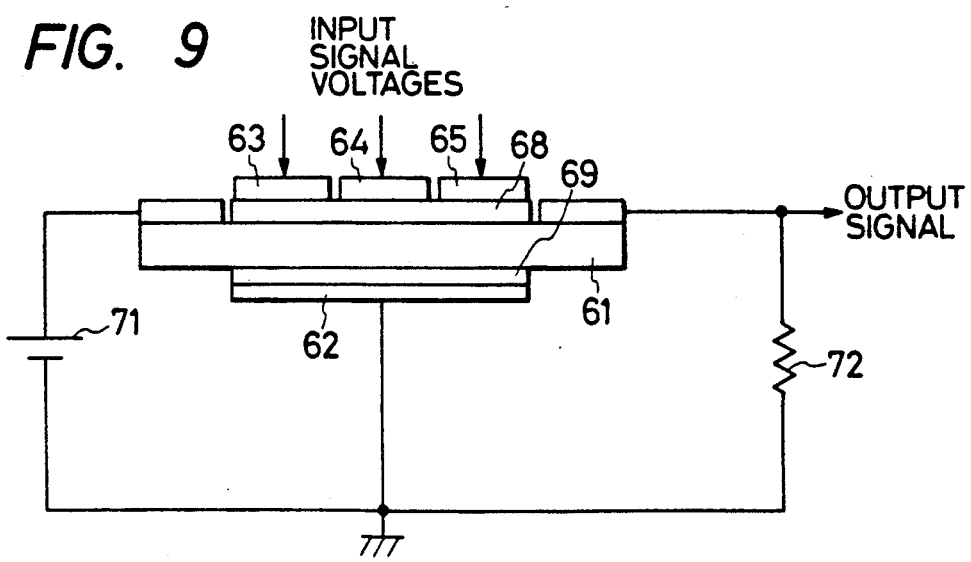
FIG. 9 is a diagram of the modulatory molecular element of FIGS. 7 and 8.

FIGS. 7-9 show a modulatory molecular element according to another embodiment of this invention. As shown in FIG. 7-9, the modulatory molecular element has a main portion 61 made of layers of lead phthalocyanine. The main portion 61 extends between a lower electrode 62 and input electrodes 63-65. Ends of the main portion 61 are connected to a power supply electrode 66 and an output electrode 67. An insulating layer 68 extends between the main portion 61 and the input electrodes 63-65. An insulating layer 69 extends between the main portion 61 and the lower electrode 62. The main portion 61 is supported on a base 70.

As shown in FIG. 9, input signal voltages are applied between the respective input electrodes 63-65 and the lower electrode 62 so that the main portion 61 is subjected to electric fields dependent on the input signal voltages. The region of the main portion 61 between the input electrode 63 and the lower electrode 62 is exposed to an electric field generated by the input signal voltage applied between the input electrode 63 and the lower electrode 62. The region of the main portion 61 between the input electrode 64 and the lower electrode 62 is exposed to an electric field generated by the input signal voltage applied between the input electrode 64 and the lower electrode 62. The region of the main portion 61 between the input electrode 65 and the lower electrode 62 is exposed to an electric field generated by the input signal voltage applied between the input electrode 65 and the lower electrode 62. The region of the main portion 61 between the input electrode 63 and the lower electrode 62, the region of the main portion 61 between the input electrode 64 and the lower electrode 62, and the region of the main portion 61 between the input electrode 65 and the lower electrode 62 are changed from first stable states to second stable states at different levels of applied electric fields respectively. In addition, these three regions of the main portion 61 have different relaxation rates respectively. This design of the three regions of the main portion 61 is realized by differentiating manufacturing conditions of the three regions. Accordingly, the three regions of the main portion 61 have different characteristics of response to the input signal voltages and different relaxation characteristics respectively.

A dc power source 71 is connected between the power supply electrode 66 and the lower electrode 62. A resistor 72 is connected between the output electrode 67 and the lower electrode 62. An output signal appears between the output electrode 67 and the lower electrode 62, that is, across the resistor 72. When all of the three regions of the main portion 61 are conductive, the main portion 61 between its ends is conductive so that the output signal has a high level voltage given by the dc power source 71. When at least one of the three regions of the main portion 61 is nonconductive, the main portion 61 between its ends is nonconductive so that the output signal has a low level voltage. The three regions of the main portion 61 change from nonconductive states to conductive states at different levels of the related input signals respectively.

What is claimed is:

1. A modulatory molecular element comprising a one-dimensional molecule group of an organic $\pi$-electron system, said molecular group including at least two of the members selected from the group consisting of a charge transfer complex group having alternately-arranged donors and acceptors, a large cyclic metal complex group, and a chelate compound consisting of a metal ion and a ligand group, and electrodes between which said one-dimensional molecule group extends, said at least two members being arranged so that application of external energy on said one-dimensional molecular group causes a reversibly physical change in at least a portion of said molecule group which physical change aries a conductive characteristic of said one-dimensional molecular group.

2. A modulatory molecular element according to claim 1, wherein said reversible physical change is selected from the group consisting of a change in physical structure, a change in bonding, a change in convalent number or a combination thereof.

3. A modulatory molecular element according to claim 1, wherein said external energy is selected from the group consisting of an electric potential, electromagnetic energy, an external stimulation of doping and combinations thereof.

4. A modulatory molecular element according to claim 1, wherein when said molecular group includes at least said large cyclic meal complex group and a ligand group arranged so that said ligand group is polymerizable in an axial direction.

5. A modulatory molecular element according to claim 1, wherein said modulatory molecular element has a threshold operational value dependent on a relaxation time of said reversible physical change.

6. A modulatory molecular element according to claim 1, wherein said acceptor molecules are selected form the groups consisting of quinoid molecules containing cyano radicals, quinoid molecules containing halogen atoms, and combinations thereof, and wherein said donor molecules are selected form the group consisting of metal, aromatic amine and fulvalene molecules containing sulfur.

7. A modulatory molecular element according to claim 1, wherein said large cyclic metal complex group is selected from the group consisting of porphyrin containing a metal, phthalocyanine containing a metal and combinations thereof.

8. A modulatory molecular element according to claim 1, wherein said ligand group includes two aromatic rings containing nitrogen which are bonded to a radical selected form the group consisting of an azo radical, an azomethine radical and radical containing a conjugated double bond.

* * * * *